US005208512A

United States Patent [19]

Forster et al.

[11] Patent Number: 5,208,512
[45] Date of Patent: May 4, 1993

[54] SCANNED ELECTRON CYCLOTRON RESONANCE PLASMA SOURCE

[75] Inventors: John C. Forster, Poughkeepsie; William M. Holber, New York; Joseph S. Logan, Poughkeepsie, all of N.Y.

[73] Assignee: International Business Machines Corporation, Armonk, N.Y.

[21] Appl. No.: 902,773

[22] Filed: Jun. 23, 1992

Related U.S. Application Data

[63] Continuation of Ser. No. 598,311, Oct. 16, 1990, abandoned.

[51] Int. Cl.$^5$ .......................... C23C 14/22; H05H 1/46
[52] U.S. Cl. ........................ 315/111.41; 315/111.21; 204/298.16; 204/298.37; 204/298.38
[58] Field of Search ...................... 315/111.21, 111.31, 315/111.41, 111.57, 111.61, 111.71, 111.81; 313/231.31; 204/298.05, 298.05, 298.06, 298.16, 298.31, 298.34, 298.36, 298.37, 298.38

[56] References Cited

U.S. PATENT DOCUMENTS

| 3,886,402 | 5/1975 | Furth et al. | 315/111.71 |
|---|---|---|---|
| 3,956,093 | 5/1976 | McLeod | 204/192 |
| 4,438,368 | 3/1984 | Abe et al. | 315/39 |
| 4,543,465 | 9/1985 | Sakudo et al. | 315/111.41 X |
| 4,559,100 | 12/1985 | Ninomiya et al. | 156/345 |
| 4,582,997 | 4/1986 | Jacquot | 315/111.81 X |
| 4,631,438 | 12/1986 | Jacquot | 313/359.1 |
| 4,638,216 | 1/1987 | Delaunay et al. | 315/111.81 |
| 4,713,585 | 12/1987 | Ohno et al. | 315/111.81 |
| 4,716,491 | 12/1987 | Ohno et al. | 361/230 |
| 4,727,293 | 2/1988 | Asmussen et al. | 315/111.41 |
| 4,733,133 | 3/1988 | Dandl | 315/111.41 |
| 4,739,169 | 4/1988 | Kurosawa et al. | 315/111.81 X |
| 4,745,337 | 5/1988 | Pichot et al. | 315/111.41 |
| 4,857,809 | 8/1989 | Torii et al. | 315/111.81 X |
| 4,947,085 | 8/1990 | Hakanishi et al. | 315/111.41 |
| 4,990,229 | 2/1991 | Campbell et al. | 204/298.06 |
| 5,122,251 | 6/1992 | Campbell et al. | 315/111.41 X |

FOREIGN PATENT DOCUMENTS

| 8606923 | 11/1986 | Australia . |
|---|---|---|
| 0028303 | 5/1981 | European Pat. Off. . |
| 0054621 | 6/1982 | European Pat. Off. . |
| 127523A | 12/1984 | European Pat. Off. . |
| 209469A | 1/1987 | European Pat. Off. . |
| 0273741 | 7/1988 | European Pat. Off. . |
| 0275965 | 7/1988 | European Pat. Off. . |
| 1198942 | 8/1965 | Fed. Rep. of Germany . |
| 3729347 | 3/1988 | Fed. Rep. of Germany . |
| 2162365 | 1/1986 | United Kingdom . |

OTHER PUBLICATIONS

IBM Technical Disclosure Bulletin; W. C. Ko and M. F. Uman; vol. 18 No. 11; Apr. 1976; pp. 3662-3663.

*Primary Examiner*—David Mis
*Attorney, Agent, or Firm*—Ratner & Prestia

[57] ABSTRACT

Electron cyclotron apparatus is described in which the locus of cyclotron resonance is scanned away from and toward the axis of a magnetic field by varying the strength of the magnetic field, the frequency of electromagnetic waves passing along its axis, or both.

15 Claims, 4 Drawing Sheets

SCANNED ELECTRON CYCLOTRON RESONANCE PLASMA SOURCE

This application is a continuation of application Ser. No. 07/598,311 filed Oct. 16, 1990 now abandoned.

BACKGROUND OF THE INVENTION

In the manufacture of solid state circuits and devices, it is often necessary to etch or deposit onto material that is exposed through openings in a mask. Whereas etching can be done by using chemical solutions, the spaces between the edges of adjacent openings have to be large enough to allow for the fact that material under the edges is undesirably removed, a phenomenon known as undercutting. This may be avoided by exposing the material in the openings of the mask to ions that are in a plasma derived by a phenomenon known as electron cyclotron resonance, ECR.

The ECR process can also be used with advantage in depositing metals, dielectrics and other substances on material exposed by the openings in a mask. In the ECR process, gas that will produce the desired ion or ions is introduced into a region of a chamber in which electromagnetic waves are propagated along the axis of a D.C. magnetic field. Any free electrons having some motion component perpendicular to the lines of flux of the field will tend to move in a circular path at a frequency determined by the strength of the magnetic field. If the electromagnetic waves have the same frequency, they impart energy to the electrons so as to cause them to dislodge electrons from atoms in the gas and form ions. Once started, the process is accumulative so as to increase the number of ions until a steady state is reached in which the number of electrons equals the number of ions and the ion generation rate equals the ion loss rate.

The electrons move along the lines of magnetic flux in a direction of the weaker field. By virtue of the electrostatic field thus created, ions tend to be pulled along the same direction.

A major problem with the ECR process is that there may be a spatial variation in the density of the ions arriving at the mask. Thus, for example, if corresponding parts of different devices are respectively exposed through openings in the mask, the amount of etching or deposition at different openings is different so that the devices may have different electrical characteristics.

This nonuniformity arises from the fact that the density with which ions are produced depends both on the intensity of the microwave illumination and on the degree to which the strength of the magnetic field approaches the optimum value required for resonance and the fact that neither is uniform across the plasma source region. Since the electrons and ions tend to follow magnetic flux lines from the source region to the substrate at which etching or deposition is to take place, the nonuniformity of the plasma across the source will be imaged onto the substrate.

One previous method for reducing the degree of nonuniformity in the flux of ions arriving at the substrate has been to use a smaller cross section source in which the microwave modes are carefully controlled. Among other problems, however, the smaller cross-section tends to reduce the ion flux at the substrate to a smaller value.

A second approach that is described in an article entitled "A Parametric Study of the Etching of Silicon in $SF_6$ Microwave Multipolar Plasmas: Interpretation of Etching Mechanisms" published at pages 825–834 of the June, 1987 issue of the Japanese Journal of Applied Physics, 26(G), operates without an axial magnetic field guiding the plasma from the source region to the substrate. Instead, a secondary cusp-type magnetic field, typically created using an array of permanent magnets bounding the drift tube connecting the source region and the substrate, aids radial confinement of the plasma and allows some mixing of radial nonuniformities of the plasma.

BRIEF SUMMARY OF THE INVENTION

As previously noted, the most dense production of ions takes place in regions where the intensity of the microwave electromagnetic field is high and where the strength of the magnetic field is such that the electrons orbit at the frequency of the microwave electromagnetic field. As a lower density occurs at other points, the density of ions produced in a cross section is not uniform.

In accordance with this invention, the location of the region at which resonance occurs is changed or scanned across the magnetic field in a cyclic manner so that the time averaged density of ions produced in all parts of the cross section of the field is nearly the same. This scanning of the region at which resonance occurs may be accomplished in accordance with this invention in the following ways.

If the magnetic field is symmetric about the axis and increases in strength with distance from the axis, then the resonance along a cross-section of the magnetic field perpendicular to the lines of flux and to the axis of the machine will take place along a circular locus centered about the axis. If the strength of the magnetic field is increased, resonance will occur along a smaller circular locus. Resonance along this latter locus could also be attained by decreasing the frequency of the electromagnetic waves. Therefore, the radius of the circular locus along which resonance occurs can be radially scanned from zero to a maximum value and back to zero by changing the strength of the magnetic field, the frequency of the electromagnetic waves or both. If, for example, it takes one minute for the number of ions to be produced that are required for an etching or deposition process step, a scanning cycle of two seconds would permit thirty cycles to be made so that the time averaged density of ions arriving at all parts of the mask would be nearly uniform.

DETAILED DESCRIPTION OF THE INVENTION

Figure 1:
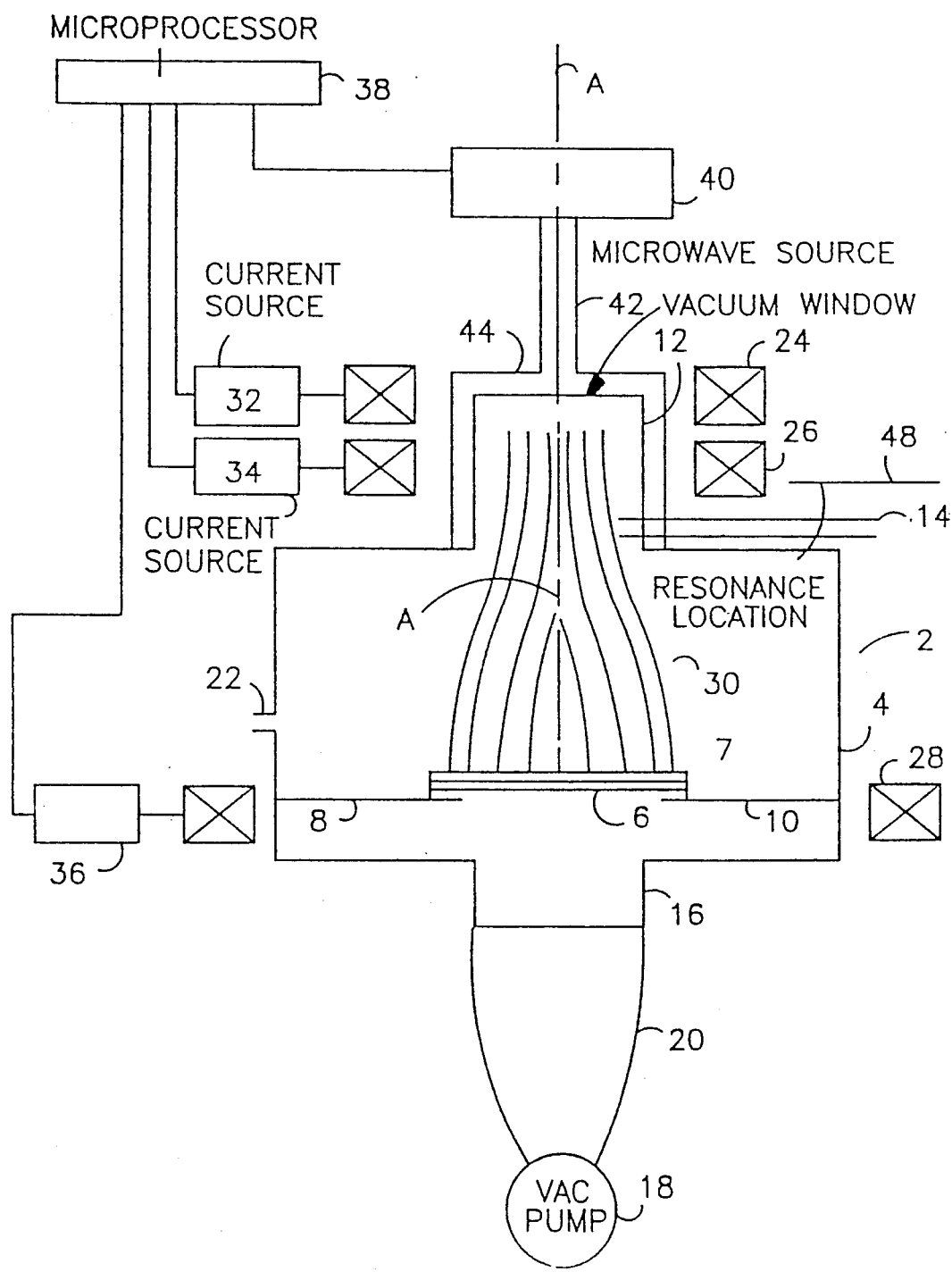
FIG. 1 is a schematic diagram of ECR apparatus incorporating this invention.

Reference is now made to the schematic representation of electron cyclotron resonance apparatus constructed in accordance with this invention for use in etching material from a substrate or for depositing material on it.

A metal chamber generally indicated at 2 has a cylindrical section 4 in which a substrate 6 to be processed and a mask 7 superimposed thereon are mounted in some suitable manner such as resting them on radial fingers 8 and 10, a cylindrical resonance section 12 made of quartz, or other suitable dielectric material, in which a plasma is formed by resonance action on gas entering the cavity 12 via a port 14, and a cylindrical section 16 at the other end to which a vacuum pump 18 may be coupled via a duct 20. This diagram is exemplary, it is contemplated, for example, that the vacuum pump 18 may be coupled to other points in the structure. If desired, a gas port 22 can be provided in the cylindrical section 4 at a point that is axially between the substrate 6 and the cylindrical resonance section 12. For example, if $SiO_2$ is to be deposited on the substrate 6, oxygen is passed through the port 14 and silane, $SiH_4$, is passed through the port 22.

Coils 24, 26 and 28 that are wound about the axis A of the resonance section 12 produce a magnetic field, a portion of which is represented by flux lines 30 that pass in a generally axial direction through the cylindrical sections 12 and 4. The coils 24, 26 and 28 are respectively powered by current supplies 32, 34 and 36 under the control of a microprocessor 38. The strength of the magnetic field decreases in a downward direction along the axis A and increases with radius within the resonance region from any point on the axis.

A source 40 of microwaves, which may be a klystron or a magnetron, directs a beam of electromagnetic waves along a waveguide 42 to a cavity section 44 that is joined to the cylindrical section 4 and which surrounds the resonance section 12. The waves enter the resonance section 12 via a vacuum window 46. In some implementations, the vacuum window and the cylindrical resonance section are a single unit made of quartz or other suitable dielectric material. The frequency and amplitude of the electromagnetic waves are controlled by the processor 38.

Figure 2:
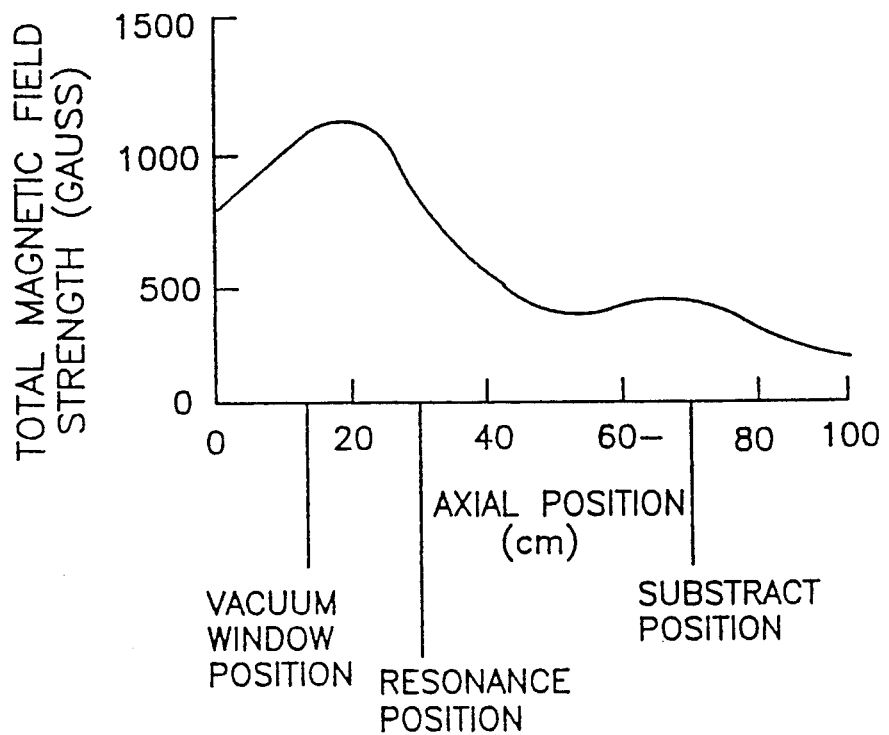
FIG. 2 illustrates an example of magnetic field strength occurring at different axial locations.

FIG. 2 illustrates a calculated line of magnetic field strength at various axial positions along the axis A that result from the action of the coils 24, 26 and 28 including the axial positions at the vacuum window 46, a radial plane 48 at which resonance occurs and the substrate 6. Note that in FIG. 1 the lines of field strength of the magnetic field are perpendicular to the substrate 6.

Figure 3:
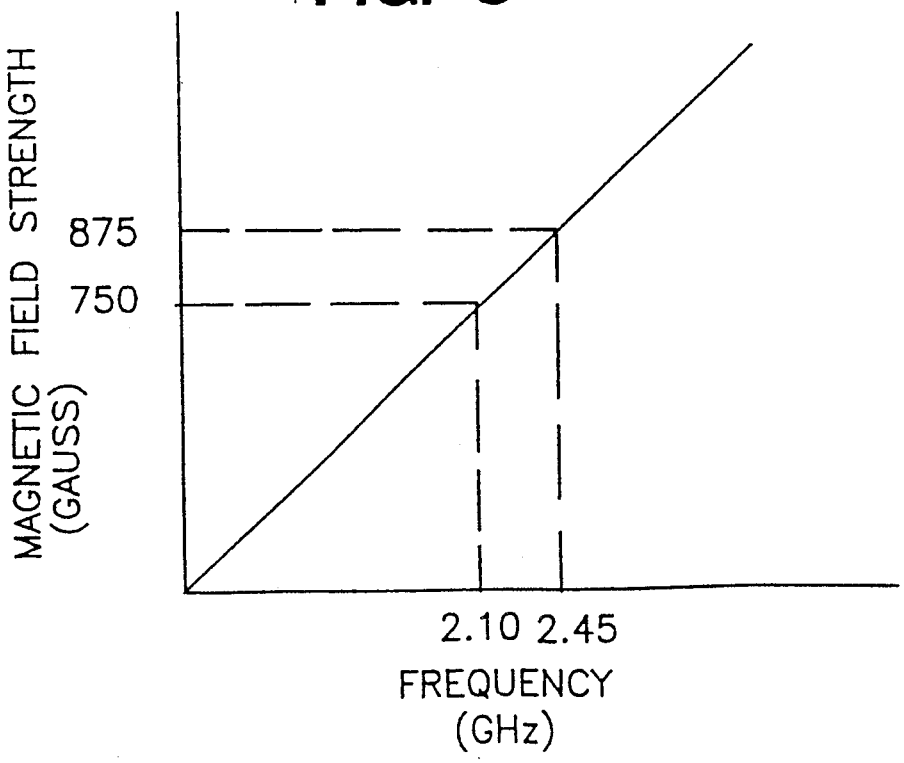
FIG. 3 is a graph showing the linear relationship between magnetic field strength and the frequency of the electromagnetic waves at resonance.

FIG. 3 is a graph of the magnetic field strength resulting from the action of the coils 24, 26 and 28 versus the frequency of the electromagnetic waves. This graph shows a locus of points at which resonance occurs. From FIG. 3, it is seen that, at a frequency of 2.1 GHz, resonance occurs when the magnetic field strength is approximately 750 Gauss and, at a frequency of 2.45 GHz, resonance occurs when the magnetic field strength is approximately 875 Gauss.

Figure 4:
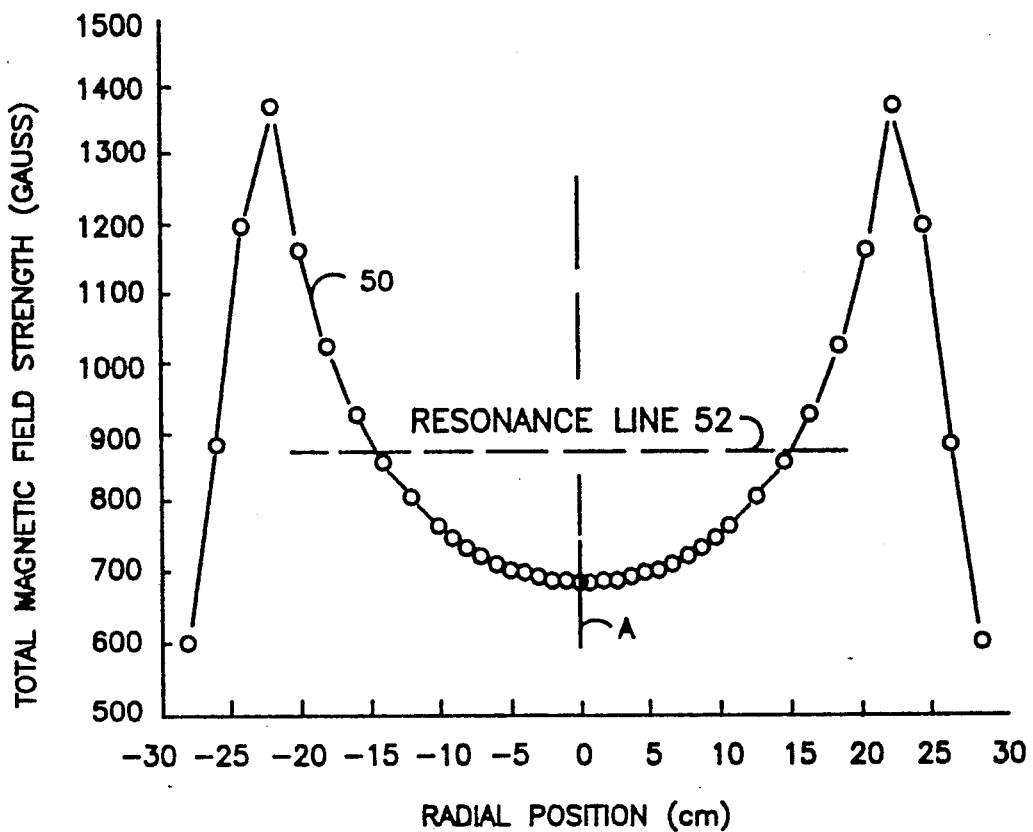
FIG. 4 is a plot of the magnetic field strength in Gauss in a radial plane as a function of radial distance from the center or axis of a cylindrical magnetic field and shows the radius at which resonance occurs when the frequencies of the electromagnetic waves is 2.45 GHz.
Figure 4A:
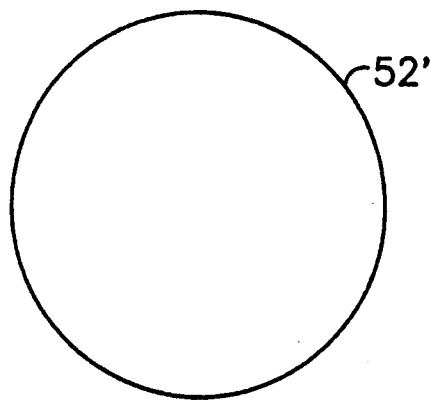
FIG. 4A shows the location of the resonance indicated in FIG. 4 when viewed along the axis.

A curve 50 in FIG. 4 illustrates the variation in the strength of the magnetic field with radial distance from the axis A when a particular set of coils 24, 26 and 28 are used in FIG. 1. With the electromagnetic waves having a frequency of 2.45 GHz, resonance occurs at 875 Gauss as indicated at the intersections of a dashed resonance line 52 with the curve 50. Since, in this example, the field strength is symmetrical about the axis A, and the intensity of the electromagnetic illumination is assumed to be uniform, the locus or region of the maximum resonance, when viewed along the axis A, is a circle 52' as shown in FIG. 4A.

The entire curve 50 can be moved up or down as indicated by the arrows so as to change the radius of the locus at which resonance and maximum plasma density occur, and hence the radius of the circle 52', by simply changing the magnitudes of the currents flowing in the coils 24, 26 and 28. A suitable cyclic variation of the currents respectively supplied by the current sources 32, 34 and 36 to the solenoid coils 24, 26 and 28 can be controlled by the processor 38. As the radius of the circle 52' at which maximum resonance occurs varies, the locus at which a maximum density of ions arriving at the mask and substrate varies in like manner, so that the maximum density of ions is radially scanned back and forth across the mask 7 and substrate.

Figure 5:
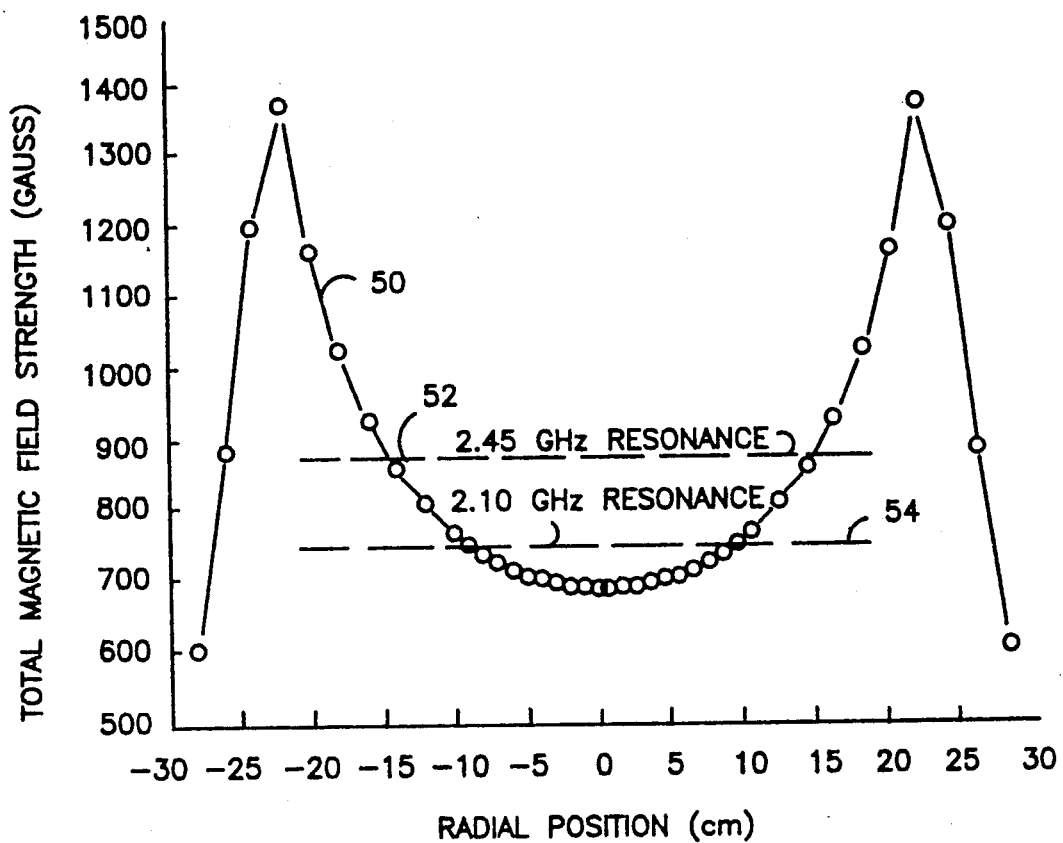
FIG. 5 is a plot of magnetic field strengths in a radial plane in Gauss as a function of radial distance from the center or axis of a cylindrical magnetic field and shows the radii at which resonance occurs when the frequencies of the electromagnetic waves are 2.10 GHz and 2.45 GHz, and, FIG. 5A shows the location of the resonance indicated in FIG. 5 when viewed along the axis.
Figure 5A:
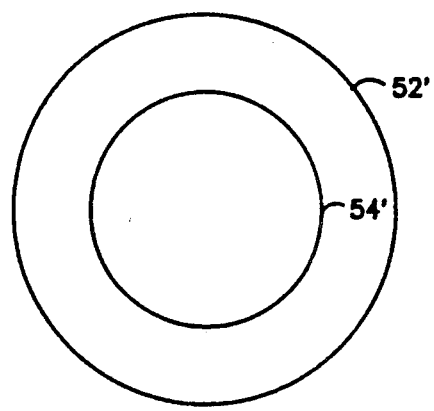

Radial scanning of the locus or region of maximum ion density can also be achieved by varying the frequency of the electromagnetic waves emanating from the source 40 under the control of the processor 38. FIGS. 5 and 5A are respectively the same as FIGS. 4 and 4A except for the addition of a dashed resonance line 54 in FIG. 5 and a corresponding circular locus 54' in FIG. 5A. The curve 50 of magnetic field strength remains the same and the dashed line at which resonance occurs moves up and down it as the frequency of the electromagnetic waves is varied. At frequencies of 2.45 GHz and 2.10 GHz, resonance respectively occurs at the loci 52' and 54'.

It is readily apparent to one skilled in the art that radial scanning of the locus of electron cyclotron resonance could be attained by varying both the magnetic field strength and the frequency of the electromagnetic waves.

It is to be understood that propagation of the electromagnetic waves along the axis of the magnetic field includes propagation along a slight angle thereto. Those skilled in the art are aware of the fact that maximum density of plasma may occur in some circumstances when the propagation is precisely along the axis and that it may fall off as the angle between the direction of propagation and the axis increases.

We claim:

1. Electron cyclotron resonance apparatus comprising:

a chamber, means for producing an axial magnetic field in said chamber that is symmetric about the axis and varies in strength with radius from the axis and decreases in strength in a given direction along the axis, means for passing electromagnetic waves into said axially symmetric magnetic field, means defining at least one opening in said chamber through which gas can be passed to a region occupied by said axially symmetric magnetic field and said electromagnetic waves, and scanning means for varying at least one of the strength of the axially symmetric magnetic field produced by said magnetic field producing means in an electron cyclotron resonance zone and the fundamental frequency of said electromagnetic waves so as to change the locus along which maximum cyclotron resonance occurs.

2. Electron cyclotron resonance apparatus as set forth in claim 1 wherein:
the electromagnetic waves are propagated along said axis.

3. Electron cyclotron resonance apparatus as set forth in claim 1 further comprising:
means for supporting a substrate in said chamber at a point along the axis, and
means for producing a collimating magnetic field having flux perpendicular to said substrate when mounted on said substrate supporting means.

4. Electron cyclotron resonance apparatus as set forth in claim 1 wherein:
said scanning means varies the strength of said axially symmetric magnetic field.

5. Electron cyclotron resonance apparatus as set forth in claim 1 wherein:
said scanning means varies the fundamental frequency of said electromagnetic waves.

6. Electron cyclotron apparatus as set forth in claim 3 further comprising:
a port in said chamber located at a point between the locus of resonance and said supporting means whereby gas may be introduced.

7. A method of producing a flow of ions to a substrate comprising the steps of:
forming an axially symmetric D.C. magnetic field with an axis,
projecting a beam of electromagnetic waves along the axis toward a substrate, and
cyclically varying at least one of the strength of the axially symmetric magnetic field in an electron cyclotron resonance zone and the fundamental frequency of the electromagnetic waves so as to cause the time averaged densities of ions arriving at different parts of the substrate to be nearly the same.

8. A method as set forth in claim 7 wherein the strength o the axially symmetric magnetic field and the fundamental frequency of the electromagnetic waves are both cyclically varied.

9. Electron cyclotron resonance apparatus for producing a flow of ions toward a substrate comprising:
means for producing an axially symmetric D.C. magnetic field having an axis,
means for projecting electromagnetic waves along said axis,
means for mounting a substrate in the axially symmetric magnetic field perpendicular to said axis, and
means for varying said axially symmetric magnetic field in magnitude in an electron cyclotron resonance zone so as to make the densities of the ions arriving at different parts of said substrate more nearly the same.

10. Electron cyclotron resonance apparatus for producing a flow of ions toward a substrate comprising:
means for producing an axially symmetric D.C. magnetic field having an axis,
means for projecting electromagnetic waves along said axis,
means for mounting a substrate in the axially symmetric magnetic field perpendicular to said axis, and
means for varying the fundamental frequency of said electromagnetic waves so as to make the densities of the ions arriving at different parts of said substrate more nearly the same.

11. Electron cyclotron resonance apparatus for producing a flow of ions toward a substrate comprising:
means for producing a D.C. magnetic field which is symmetric about an axis,
means for projecting electromagnetic waves along said axis,
means for mounting a substrate in the axially symmetric magnetic field transversely to said axis, and
means for cyclically varying the fundamental frequency of the electromagnetic waves so as to make the densities of the ions arriving at different parts of the substrate more nearly the same.

12. Electron cyclotron resonance apparatus for producing a flow of ions toward a substrate comprising:
means for producing a D.C. magnetic field which is symmetric about an axis,
means for projecting electromagnetic waves along said axis,
means for mounting a substrate in the axially symmetric magnetic field perpendicular to said axis, and
means for cyclically varying the magnitude of the axially symmetric magnetic field in an electron cyclotron resonance zone so as to make the densities of the ions arriving at different parts of the substrate more nearly the same.

13. Electron cyclotron resonance apparatus comprising:
means defining a chamber having a resonance section;
means for introducing gas into said resonance section;
a coil wound about said resonance section;
means for supporting a substrate in said chamber;
a source of electromagnetic waves;
means for directing electromagnetic waves from said source through said resonance section; and
control means for varying one of current in said coil and the fundamental frequency of said electromagnetic waves so as to change the locus of cyclotron resonance within said resonance section, whereby the locus of the maximum density of ions arriving at said substrate on said support means is radially scanned across the substrate.

14. Electron cyclotron resonance apparatus as set forth in claim 13 wherein said control means varies the current in said coil.

15. Electron cyclotron resonance apparatus as set forth in claim 13 wherein said control means varies the fundamental frequency of the electromagnetic waves provided by said source.

* * * * *